(12) United States Patent
Nguyen et al.

(10) Patent No.: US 10,050,602 B2
(45) Date of Patent: Aug. 14, 2018

(54) TUNABLE Q RESONATOR

(71) Applicant: THE REGENTS OF THE UNIVERSITY OF CALIFORNIA, Oakland, CA (US)

(72) Inventors: Clark T.-C. Nguyen, Oakland, CA (US); Robert A. Schneider, Berkeley, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 149 days.

(21) Appl. No.: 15/073,383

(22) Filed: Mar. 17, 2016

(65) Prior Publication Data
US 2016/0268999 A1 Sep. 15, 2016

Related U.S. Application Data

(63) Continuation of application No. PCT/US2014/056397, filed on Sep. 18, 2014.
(Continued)

(51) Int. Cl.
H03H 9/15 (2006.01)
H03H 9/24 (2006.01)
(Continued)

(52) U.S. Cl.
CPC ........ H03H 9/467 (2013.01); H03H 9/02259 (2013.01); H03H 9/02409 (2013.01);
(Continued)

(58) Field of Classification Search
CPC ........... H03H 9/02259; H03H 9/02393; H03H 9/02409; H03H 9/02417; H03H 9/02425;
(Continued)

(56) References Cited

U.S. PATENT DOCUMENTS 5,596,239 A * 1/1997 Dydyk .................. H03H 3/04
310/311
5,714,917 A 2/1998 Ella
(Continued)

FOREIGN PATENT DOCUMENTS

EP 0 797 300 A1 * 7/1993
EP 1936733 A1 6/2008
(Continued)

OTHER PUBLICATIONS

W. Pang et al.; "Electrically Tunable and Switchable Film Bulk Acoustic Resonator"; 2004 IEEE International Ultrasonics, Ferroelectrics, and Frequency Control Joint 50th Anniversary Conference, 2004, pp. 22-26.*
(Continued)

Primary Examiner — Barbara Summons
(74) Attorney, Agent, or Firm — O'Banion & Ritchey LLP; John P. O'Banion

(57) ABSTRACT

A tunable Q resonator using a capacitive-piezoelectric transducer provides a flexible top electrode above an AlN resonator. The top electrode can be pulled electrostatically towards the resonator and substrate, forming a frictional contact with either the resonator or the combined resonator-electrode structure to the substrate, allowing for electrical tuning the Q of the resonator. With a sufficient electrostatic bias voltage $V_b$, the resonator may be completely turned OFF, allowing for an integrated switchable AlN resonator. Such switchable resonator may be integrated into a radio frequency (RF) front end as a digitally selectable band pass filter element, obviating the need for ancillary micromechanical switches in the signal path. The device has been demonstrated with a Q approaching 9,000, together with ON/OFF switchability and electromechanical coupling up to 0.63%. Flexible positioning of the top electrode allows for
(Continued)

actively controlling the series resonant frequency of the resonator through changes in capacitive coupling.

25 Claims, 12 Drawing Sheets

Related U.S. Application Data

(60) Provisional application No. 61/879,556, filed on Sep. 18, 2013.

(51) Int. Cl.
| | |
|---|---|
| *H03H 9/46* | (2006.01) |
| *H03H 9/54* | (2006.01) |
| *H03H 9/02* | (2006.01) |
| *H03H 9/17* | (2006.01) |
| *H03H 9/50* | (2006.01) |
| *H03H 9/58* | (2006.01) |

(52) U.S. Cl.
CPC .......... *H03H 9/02425* (2013.01); *H03H 9/17* (2013.01); *H03H 9/2436* (2013.01); *H03H 9/505* (2013.01); *H03H 9/54* (2013.01); *H03H 9/58* (2013.01); *H03H 2009/02503* (2013.01)

(58) Field of Classification Search
CPC .......... H03H 9/13; H03H 9/17; H03H 9/2436; H03H 9/462; H03H 9/467; H03H 9/505; H03H 9/54; H03H 9/58; H03H 2009/02283; H03H 2009/02503; H03H 2009/155; B81B 2201/01; B81B 2201/0271
USPC .................................................. 333/186–189
See application file for complete search history.

(56) References Cited

U.S. PATENT DOCUMENTS

| | | | | |
|---|---|---|---|---|
| 6,204,737 B1* | 3/2001 | Ella | ................... | H01P 1/127 310/321 |
| 6,628,177 B2* | 9/2003 | Clark | ................... | H03H 3/007 310/309 |
| 6,958,566 B2* | 10/2005 | Nguyen | ............. | H03H 9/02448 310/321 |
| 7,372,346 B2* | 5/2008 | Tilmans | ............. | H03H 9/02102 333/187 |
| 7,804,382 B2* | 9/2010 | Shin | ................... | H03H 9/171 310/312 |
| 8,106,723 B2* | 1/2012 | Watanabe | .......... | H03H 9/02409 331/116 M |
| 8,164,399 B2* | 4/2012 | Isobe | ................... | H03H 3/02 333/187 |
| 9,276,557 B1* | 3/2016 | Nordquist | ............ | H03H 9/6403 |
| 2013/0249649 A1* | 9/2013 | Kawai | ................... | H03H 3/04 333/187 |
| 2014/0125431 A1* | 5/2014 | Bhattacharjee | .... | H03H 9/02275 333/186 |

FOREIGN PATENT DOCUMENTS

| | | |
|---|---|---|
| JP | 2005-236338 A | 9/2005 |
| KR | 10-2001-0017168 A | 3/2001 |
| WO | 2013-059749 A1 | 4/2013 |

OTHER PUBLICATIONS

M. El Hassan et al.; "A Study on FBAR Filters Reconfiguration"; published in 12th IEEE International Conference on Electronics, Circuits and Systems, ICECS 2005, Dec. 11-14, 2005, 4 pages and 1 page IEEE Xplore Abstract.*
M. El Hassan et al.; "A Multistandard RF Receiver Front-End Using a Reconfigurable FBAR Filter"; published in 2006 IEEE North-East Workshop on Circuits and Systems, Jun. 18-21, 2006, pp. 173-176 and 1 page IEEE Xplore Abstract.*
Korean Intellectual Property Office (KIPO), international search report and written opinion, PCT/US2014/056397, dated Jun. 23, 2015, pp. 1-13, with claims searched, pp. 14-19, corresponding to the application filed herewith. The relevance of the non-English language references listed above is set forth in this report, and therefore, a separate concise explanation of the relevance is not required.
Rosen, D. et al., "Supression of spurious lateral modes in thickness-excited FBAR resonators.", IEEE Trans Ultrason Ferroelectr Freq Control, Jul. 2005; 52(7): 1189-92, 1 page Abstract downloaded Jan. 22, 2018.

* cited by examiner

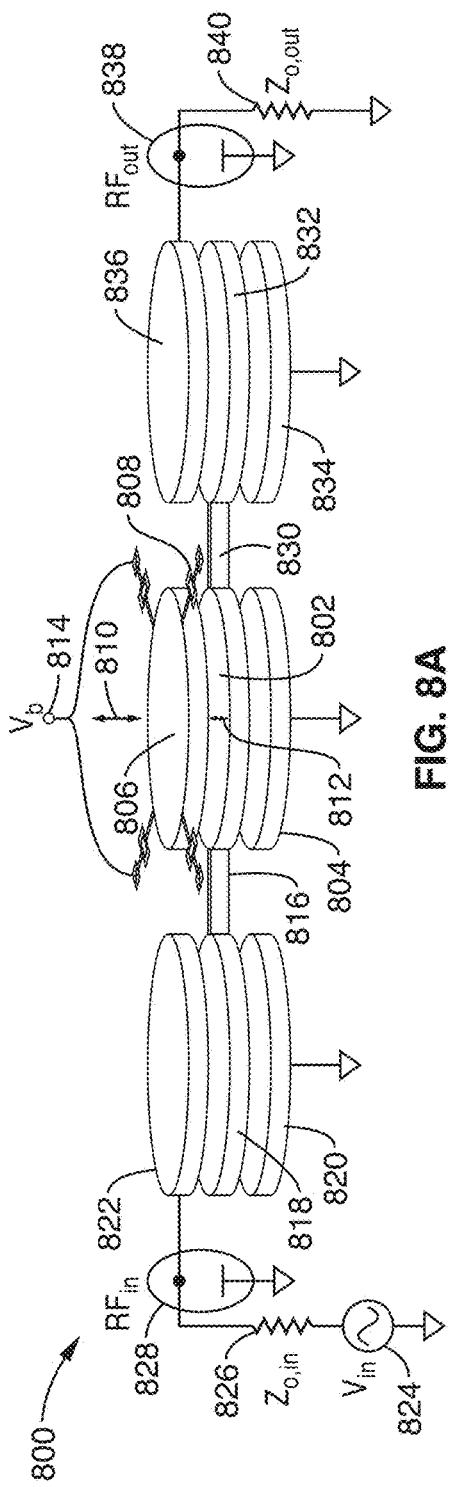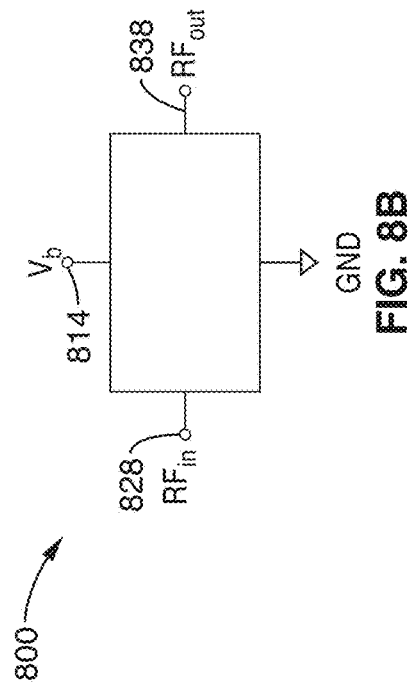
FIG. 8A
FIG. 8B

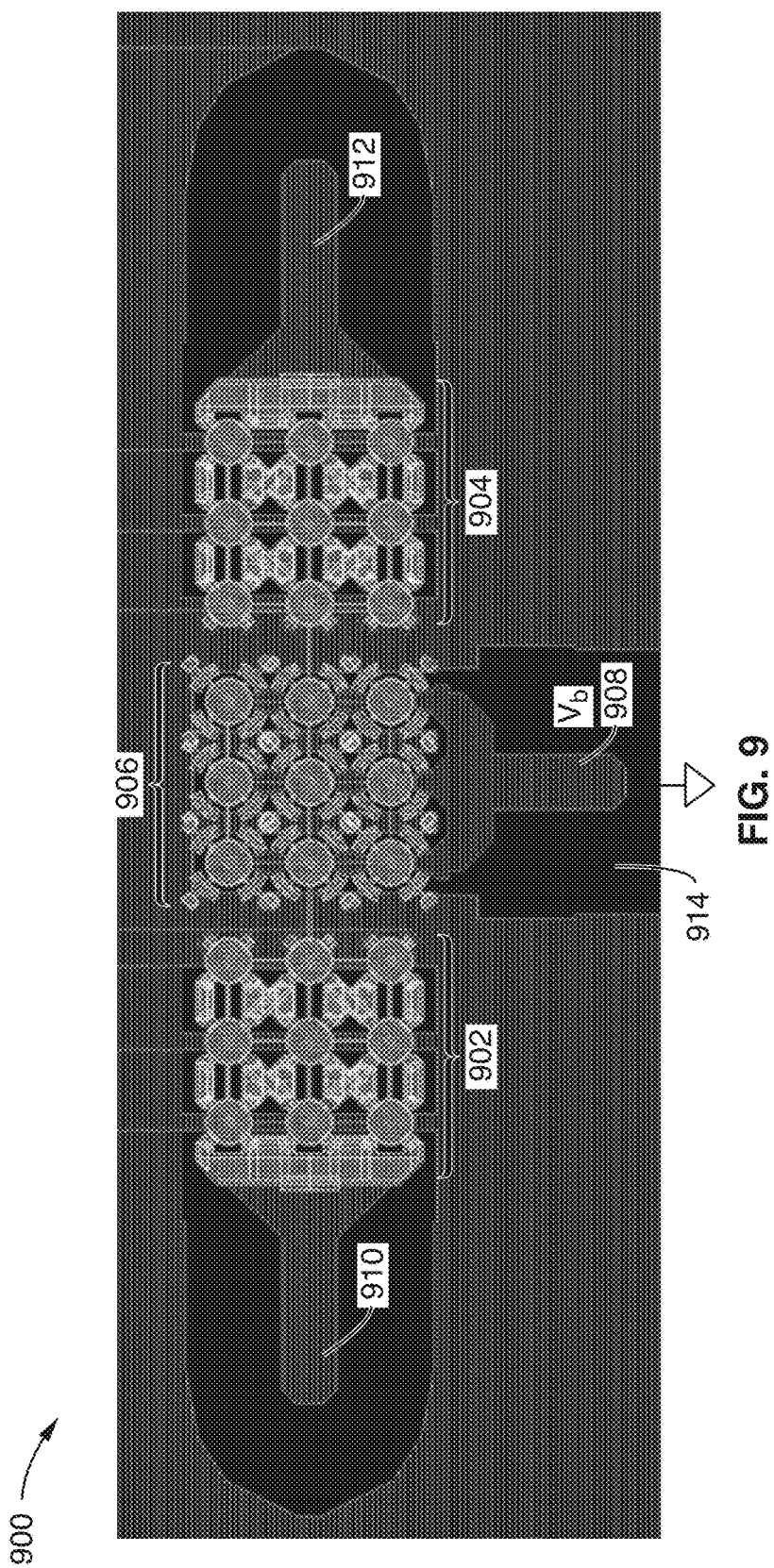

TUNABLE Q RESONATOR

CROSS-REFERENCE TO RELATED APPLICATIONS

This application is a 35 U.S.C. § 111(a) continuation of PCT international application number PCT/US2014/056397 filed on Sep. 18, 2014, incorporated herein by reference in its entirety, which claims priority to, and the benefit of, U.S. provisional patent application Ser. No. 61/879,556 filed on Sep. 18, 2013, incorporated herein by reference in its entirety. Priority is claimed to each of the foregoing applications.

The above-referenced PCT international application was published as PCT International Publication No. WO 2015/084456 on Jun. 11, 2015, and republished on Aug. 13, 2015, and each publication is incorporated herein by reference in its entirety.

STATEMENT REGARDING FEDERALLY SPONSORED RESEARCH OR DEVELOPMENT

This invention was made with Government support under W31P4Q-09-1-0006 awarded by the Defense Advanced Research Projects Agency (DARPA). The Government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

This technology pertains generally to piezoelectric oscillators, more particularly to switched piezoelectric oscillators, and still more particularly to piezoelectric oscillators with a variable Q.

2. Background Discussion

Conventionally, micromechanical switches must be disposed along the signal path to attached electrode AlN resonators in order to switch such resonators on or off. Such switches have associated insertion losses, tend to increase part count, and decrease overall system reliability.

If the resonators to be switched are hooked in a parallel bank, the use of series switches either before or after each resonator leads to changes in input or output capacitance, respectively, when different sets of resonators are turned on and off. This makes impedance matching to adjacent stages a dynamic problem, and more difficult to solve.

BRIEF SUMMARY

A tunable Q resonator uses a flexible top electrode spaced above an AlN resonator. The top electrode can be pulled electrostatically towards the resonator and substrate, forming a lossy contact with either the resonator, or the combined resonator-electrode structure to the substrate, allowing for electrical tuning of the Q of the resonator.

By tuning the Q with frictional or other losses from the electrode-resonator combination, the Q will decrease to a minimum value of 0, in which case the resonator is in an OFF state. With a sufficient electrostatic bias voltage $V_b$, the resonator may be completely turned OFF, allowing for an integrated switchable AlN resonator.

The switchable resonator described above may be integrated into a radio frequency (RF) front end as a digitally selectable band pass filter element, obviating the need for ancillary micromechanical switches in the signal path. The device has been demonstrated with a Q approaching 9,000, together with ON/OFF switchability and electromechanical coupling $k_{eff}^2$ up to 0.63%.

This document discloses a method and structure for realizing a piezoelectric resonator with a tunable transfer function, i.e., tunable Q, tunable center frequency, or both. Here, the Q is tunable to many values, and can be tuned down to such small values that the device can be considered "OFF" relative to the background signal, i.e., this technology allows for ON/OFF switching of a piezoelectric resonator. The demonstrated embodiment utilizes a capacitive piezoelectric transducer, featuring a piezoelectric structure suspended between a bottom electrode (attached to the substrate) and a top electrode, which is suspended above the piezoelectric. The piezoelectric resonator Q (or transfer function) is altered by applying a bias voltage $V_b$ between the bottom electrode and top electrode, which electrostatically pulls the electrodes together. Specifically, the top electrode pulls into the piezoelectric resonator first, contacting it and introducing friction and other losses in the process, all of which lower its Q, and also reduces the resonator gain. Further increases in applied DC bias voltage $V_b$ then pulls the top electrode-resonator twosome to collapse onto the bottom electrode and the substrate, which then dissipates even more energy through frictional losses, lowering the Q of the resonator to a point where there is no more resonant peak above the background signal, where the device is effectively "OFF".

This technology solves the long-standing problem of how to switch piezoelectric filters when utilized in switchable filter banks, such as is needed for radio frequency (RF) channel selection. It obviates the need for separate low loss switches, which otherwise would be needed in series with piezoelectric resonators to turn them on or off, adding insertion loss, increasing part count, raising system cost, and reducing system reliability. In addition, the ability to adjust filter gain makes possible low power automatic gain control via the resonator in a receiver front-end.

This technology solves the long-standing problem of how to switch piezoelectric filters when utilized in switchable filter banks, such as is needed for RF channel selection.

Further aspects of the technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only:

FIG. 7A is a cross sectional view of a switched oscillator, where the oscillator is ON.

FIG. 8A is a perspective view of a four terminal switched piezoelectric filter.

FIG. 8B is a circuit element describing the four terminal switched piezoelectric filter of FIG. 8A.

FIG. 9 is a top view of one practical implementation of the simplified four terminal, $3^{rd}$ order, switched piezoelectric filter of FIG. 8A, differing primarily in its use of disk-array composite resonators, and using mechanically coupled-array resonators with the center one switchable to turn the filter on or off or vary its frequency without changing its input or output capacitance.

DETAILED DESCRIPTION

Resonator ON/OFF Switching

Voltage-controlled ON/OFF switching based on electrode deformation around a 301-MHz capacitive-piezoelectric aluminum nitride (AlN) contour-mode disk resonator has been demonstrated, while concurrently allowing ON-state Q's as high as 8,800; the highest yet demonstrated around 300 MHz in sputtered AlN.

Figure 1A:
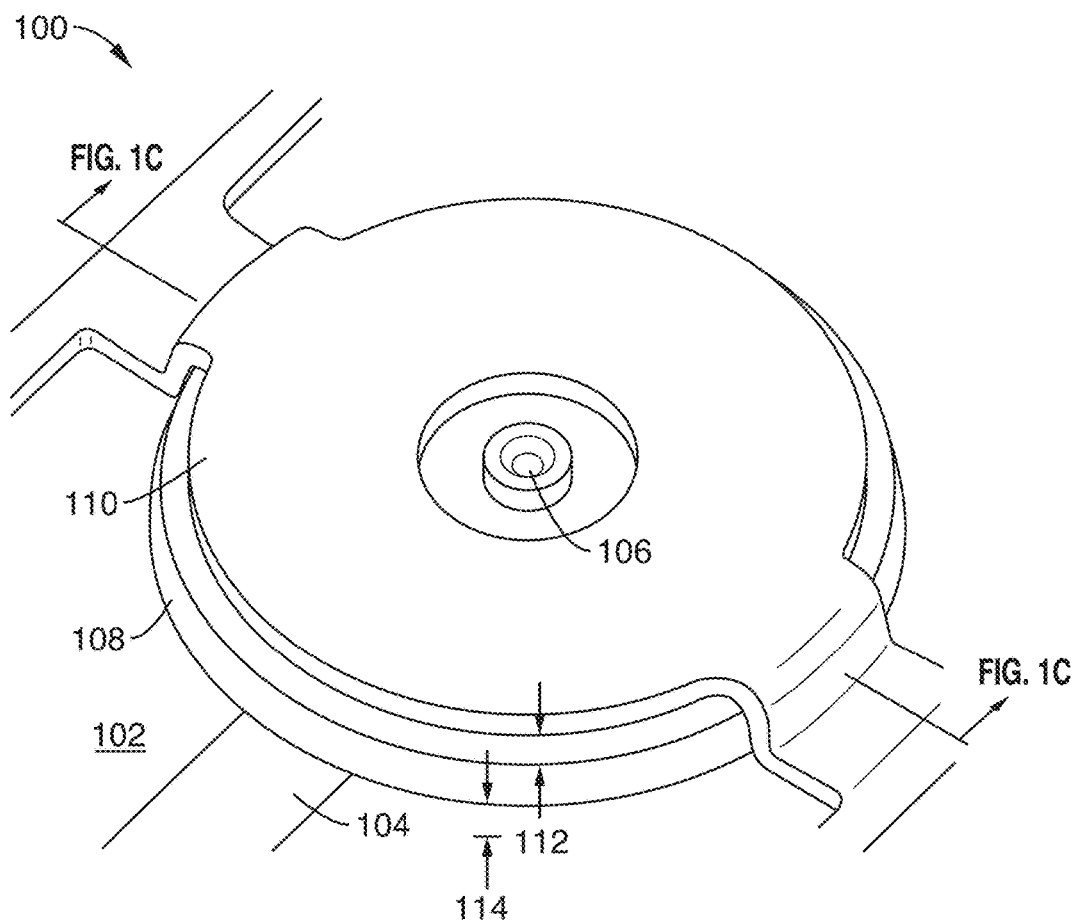
FIG. 1A is a schematic diagram of a scanning electron micrograph (SEM) of a tunable 300 MHz capacitive piezoelectric radial-contour mode disk resonator embodiment, where the flexible top electrode is free to bend downward, eventually turning off the resonator, through an electrostatic force that pulls the top electrode toward the bottom electrode.

Refer now to FIG. 1A, which is a rendering of a scanning electron micrograph (SEM) of a 300 MHz capacitive piezoelectric radial-contour mode disk resonator 100 embodiment. Here a substrate 102 has built upon it a bottom electrode 104. A central stem 106 projects upward from the substrate 102, supporting a piezoelectric radial-contour mode disk resonator 108. A top electrode 110 is disposed above the resonator 108.

The top electrode 110 may be controllably flexed downward, effectively turning off the disk resonator 108. Such ON/OFF switching may be accomplished through an electrostatic force that pulls the top electrode 110 toward the bottom electrode 104. Alternatively, the top electrode 110 may be drawn instead to the disk resonator 108. Finally, the top electrode 110 may be sufficiently flexed so that the disk resonator 108 is captured between the top electrode 110 and the bottom electrode 104.

Flexure of the top electrode 110 may be accomplished through the imposition of a suitable voltage between the top electrode 110 and the bottom electrode 104. Such flexure is then said to be electrostatically induced.

Gap 112 nominally exists between the bottom electrode 104 and the disk oscillator 108. Similarly, gap 114 exists between the disk oscillator 108 and the top electrode 110. Both gaps allow for high-Q operation of the disk oscillator 108 during ON operation. However, one or both of these gaps 112 and 114 may be partially closed by application of a suitable voltage between the top electrode 110 and the bottom electrode 104.

The ON/OFF switching of the switched disk resonator 100 is achieved by its capacitive-piezoelectric transducer structure, which provides a suspended top electrode 110 above the disk resonator 108, where the top electrode 110 can be pulled electrostatically towards the substrate 102, pinning the combined resonator-electrode structure (110 and 108) to the substrate 102, thereby opening energy loss dissipation paths for attenuating (or even terminating in the case of switching OFF) input signal transmission through mechanical frictional losses.

The ON/OFF switchability of the disk resonator 100 obviates the need for micromechanical switches in the signal path along with their associated insertion losses, which otherwise would be needed by typical attached-electrode AlN resonator counterparts.

The disk resonator 100, with a Q approaching 9,000, together with the demonstrated on/off switchability and electromechanical coupling $k_{eff}^2$ up to 0.63%, make the disk resonator 100 a strong contender among resonator technologies targeting radio frequency (RF) channel-selecting communication front-ends, as illustrated below.

Figure 1B:
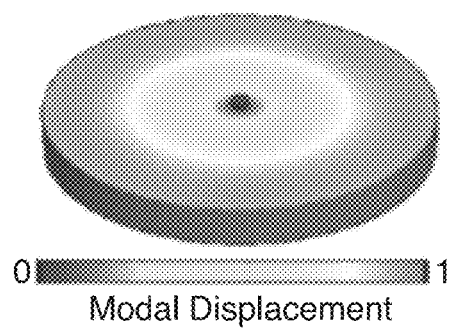
FIG. 1B is a depiction of the vibrational mode shape for the radial contour mode disk resonator of FIG. 1A.

Refer now to FIG. 1B, which is a depiction of the modeled vibrational mode shape for the embodiment of FIG. 1A. This demonstrates the radial-contour vibrational mode of the resonator 100. The resonator 100 may be a disk or other resonant shape.

Figure 1C:
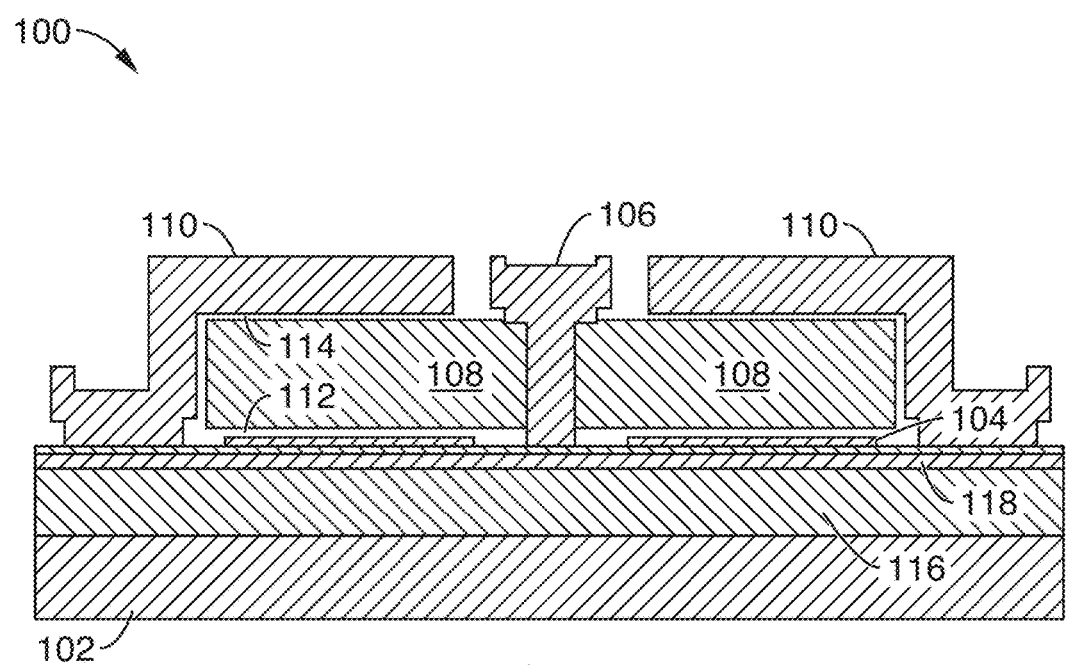
FIG. 1C is a cross section of the resonator structure of FIG. 1A.

Refer now to FIG. 1C, which is a cross section of the disk resonator 100 embodiment of FIG. 1A. Here, it is more easily observed that the disk oscillator 108 is suspended above the substrate 102 by use of a central stem 106 (here comprised of polysilicon). The bottom electrode 104 (here comprised of Mo) is electrically isolated from the remainder of the resonator 100 structure by use of a $SiO_2$ insulation layer 116, a $Si_3N_4$ insulation layer 118, or (as used here) both.

FIG. 1C shows the bottom electrode 104 comprised of molybdenum attached to the substrate 102 structure. The bottom electrode 102 is spaced underneath the oscillator 108 with a 150 nm clearance gap 112. The bottom electrode 104 is insulated from the conductive substrate 102 using 2-µm- and 0.5-µm-thick layers of silicon dioxide and silicon nitride, respectively.

The top electrode 110 is a 600 nm-thick doped-polysilicon plate suspended above the oscillator 108 with a 200 nm gap. This embodiment differs from others in that the top electrode 110 anchors to the substrate 102 at points outside the oscillator 108 area rather than at its center, allowing for greater flexibility in placement of multiple electrodes.

Clearly, multiple top electrodes 110 may be placed in parallel above the oscillator 108 to create a microelectromechanical system (MEMS) equivalent to an ANDed logic gate, with each top electrode 110 operating with a separate bias voltage $V_b$.

While the embodiment most discussed is aluminum nitride, other piezoelectric materials could include zinc oxide (ZnO), gallium nitride (GaN), and lithium niobate (LiNbO3). Lead zirconate titanate $(Pb[Zr(x)Ti(1-x)]O_3)$, (otherwise referred to as "PZT") is another piezoelectric material that may be used. However, PZT would likely couple very poorly due to air gaps. Finally, quartz, yet another piezoelectric material, cannot at this time be properly grown at this length scale, although it can be bonded, so it is also viable.

Resonator Tunable Q Operation

Previously, the disk resonator 100 was described as a switched ON/OFF resonator through application of a bias voltage applied between the top electrode 110 and the bottom electrode 104 in essentially digital operation. Normally open operation was achieved through application of 0 V of bias voltage $V_b$. Closed (or OFF) conditions were achieved through application of a sufficient bias voltage $V_b$ so as to cause the resonator 100 to stop oscillating.

However, there is a middle range of application of the bias voltage $V_b$ where frictional effects have begun to degrade the Q of the resonator 100, yet oscillation still continues. In this middle range, the Q of the device is modified through frictional losses. Typically, this tends to increase the insertion loss for the device.

As happens with oscillators with decreased Q, the frequency band pass response is increased, and selectivity reduced. By designing devices with ranges of Q versus bias voltage $V_b$, resonators with tunable Q may be constructed.

Figure 2A:
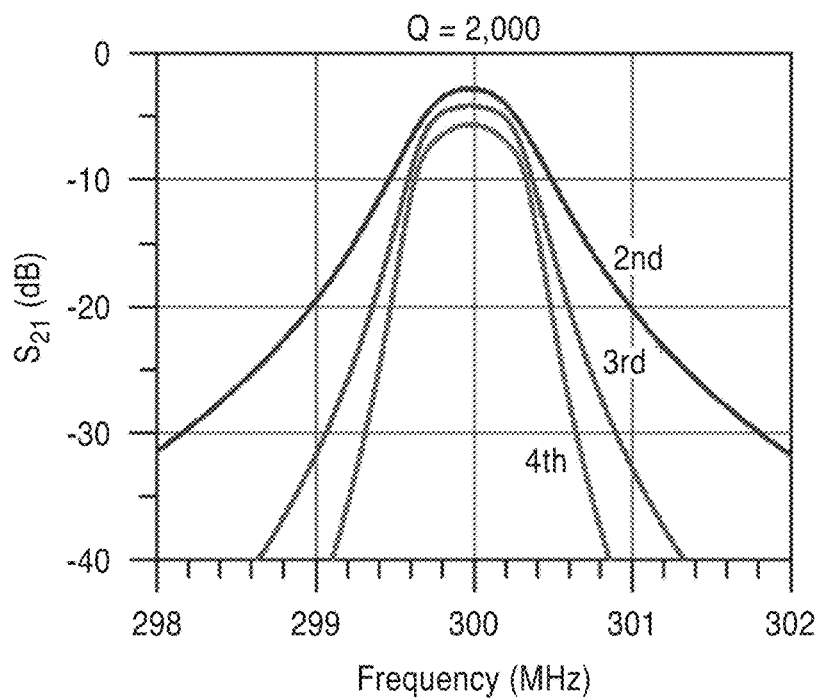
FIG. 2A is a graph depicting the vibrational mode shape of the transfer function $S_{21}$ of a 0.2% bandwidth channel-select $2^{nd}$, $3^{rd}$ and $4^{th}$ order filters using a resonator embodiment with a Q of 2000.
Figure 2B:
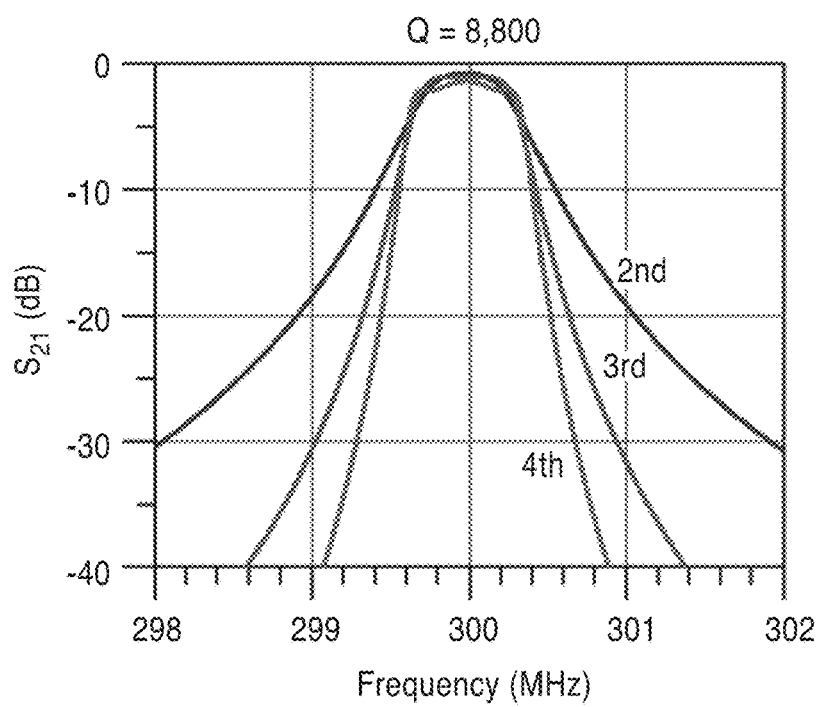
FIG. 2B is a simulated graph of the transfer function $S_{21}$ of FIG. 2A, but using a resonator Q of 8800, where raising the resonator Q to 8,800 reduces insertion loss to acceptable levels of <2 dB for each of the three filters.

Refer now to FIGS. 2A and 2B. FIG. 2A and FIG. 2B are simulated graphs of a transfer function $S_{21}$ of 0.2% bandwidth channel-select $2^{nd}$, $3^{rd}$ and $4^{th}$ order filters using resonators respectively having Q's of 2000 (in FIG. 2A), and Q's of 8,800 (in FIG. 2B). Here, due to the relatively low Q's of FIG. 2A, the insertion losses of the filters are each 3 dB or greater in the pass band. Insertion loss is seen to increase with filter order when resonator Q is insufficient, yet high filter orders are otherwise desirable due to their steep stop band roll off.

However, in FIG. 2B, the resonator has been redesigned for a higher Q operation at 8,800. It is seen that the disk resonator 100 filter insertion loss is less than 2 dB in the case of the higher Q.

Figure 3A:
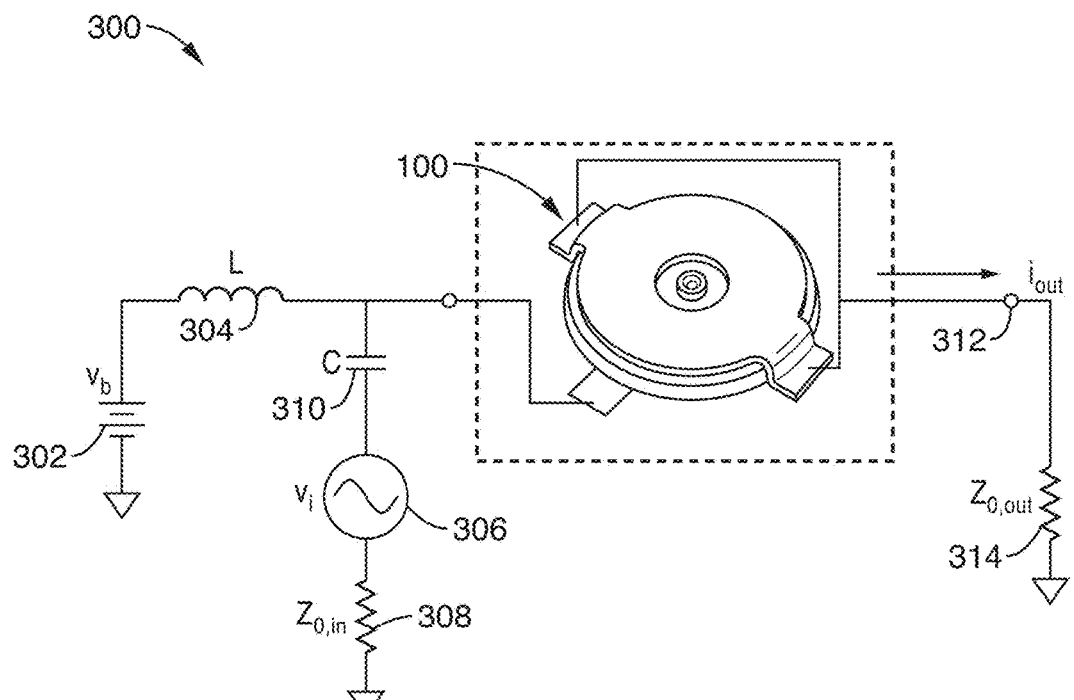
FIG. 3A is a schematic diagram of a circuit and switching system developed to test an embodiment of the technology described herein.

Refer now to FIG. 3A, which is a schematic 300 of a circuit and switching system developed to test embodiments of the technology described herein. Here, a perspective view schematic of the embodiment of FIG. 1A through FIG. 1C is presented, along with the signal and control voltages needed to operate the device when in the ON-state; and to switch it OFF.

Bias voltage $V_b$ 302 provides a bias voltage for disk resonator 100 Q control through inductor L, 304. Input source voltage $V_i$ 306 is the oscillator input, with source reactance $Z_{0,in}$ 308. The input source voltage $V_i$ 306 is capacitively coupled to the disk resonator 100 through capacitor C 310.

Output from the oscillator 100 is an output current $i_{out}$ 312 through output reactance $Z_{0,out}$ 314. By varying the amplitude of $V_b$, one may turn the disk resonator 100 ON or OFF, or modulate the Q of the disk resonator 100 from its maximum value to 0 (when the oscillator 100 is OFF).

Figure 3B:
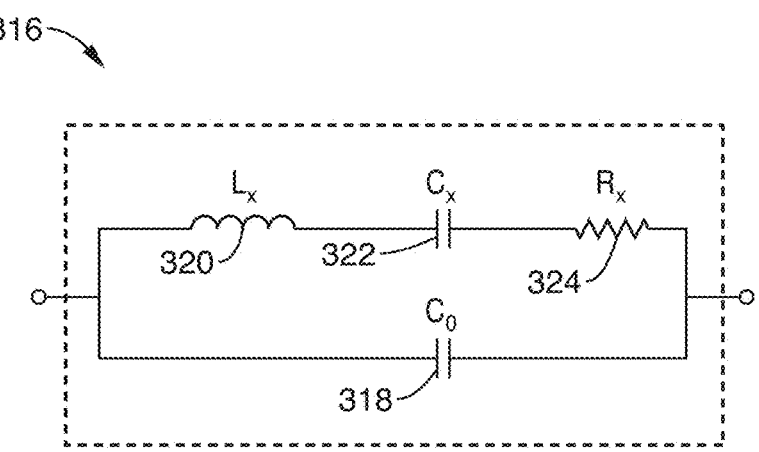
FIG. 3B is a schematic diagram of the equivalent circuit for the oscillator embodiment of FIG. 3A, where the one-port equivalent circuit parameters are extracted using a two-port network analyzer measurement scheme.

Refer now to FIG. 3B, which is a schematic of the equivalent circuit for the disk resonator 100 embodiment of FIG. 3A, where the one-port equivalent circuit parameters are extracted using a two-port network analyzer measurement scheme. Here, the disk resonator 100 is modeled 316 by a shunt capacitor $C_0$ 318 in parallel with three series component, $L_x$ 320, $C_x$ 322, and $R_x$ 324. FIG. 3B is but one of many possible models approximating the behavior of disk resonator 100 at a particular bias voltage ($V_b$ of FIG. 3A).

It should be noted that by using the values of $C_0$ 318 and $C_x$ 322, the electromechanical coupling coefficient (EMCC) may be calculated as follows:

$$k_{eff}^2 = C_x/C_0 = \frac{f_p^2 - f_s^2}{f_p^2}.$$

Figure 4:
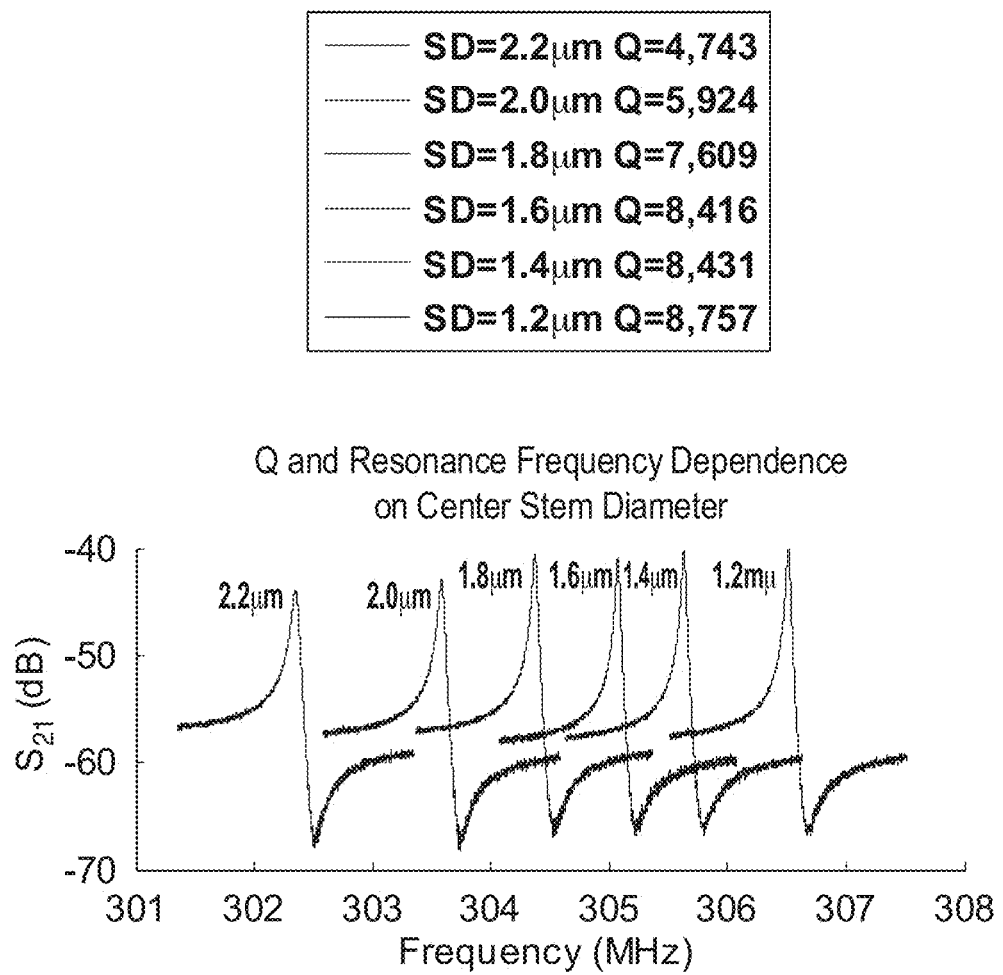
FIG. 4 is a graph showing the dependence of Q and resonance frequency on the center stem radius for six adjacent resonators, including a Q of 8,757 for the smallest stem size.

Refer now to FIG. 4, which is a graph showing the dependence of Q and resonance frequency on the central stem (106 of FIG. 1A) radius for six adjacent resonators, including a Q of 8,757 for the smallest stem size. It was found that oscillator energy losses decreased as the central stem 106 (shown in FIG. 1A) radius decreased.

In FIG. 4, the ON-states of the embodiment of FIG. 3A and FIG. 3B for a 11.18 µm radius device are shown operating in the contour-mode plots of $S_{21}$ as a function of stem diameter, showing how the Q's of the embodiment depend strongly on the width of their central stems. Here, the smallest central stem diameter of 1.2 µm yields a measured Q of 8,757, about 4.2 times higher than the Q of about 2,100 traditionally reported for conventional AlN resonators that have attached electrodes in this frequency range.

Referring back to FIGS. 3A and 3B, the ON-state operation of the one-port device entails merely applying an ac input voltage $V_1$ 306 with the DC voltage $V_b$=0 V and sensing the output current $i_{out}$ 312.

Figure 5A:
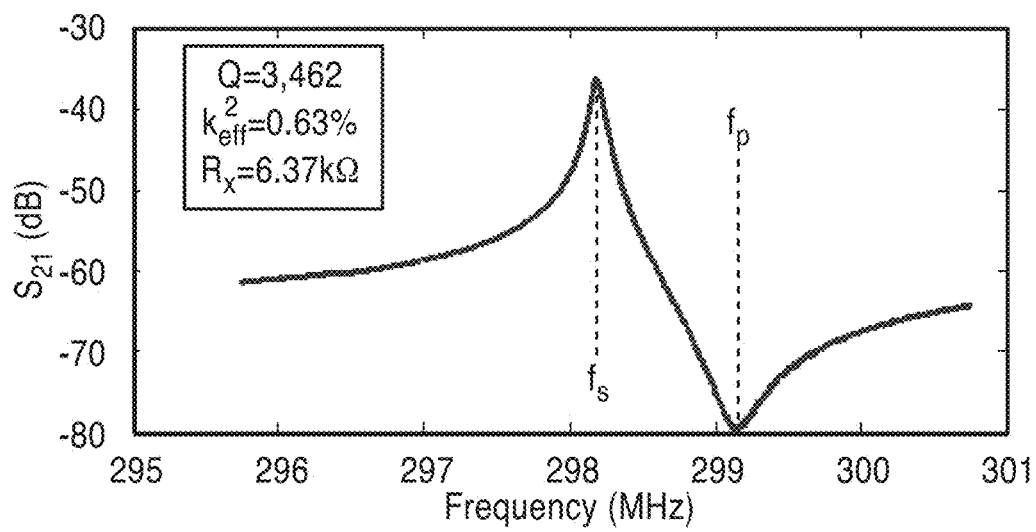
FIG. 5A is a graph of the frequency response for the oscillator with the highest measured $k_{eff}^2$ of 0.63%.
Figure 5B:
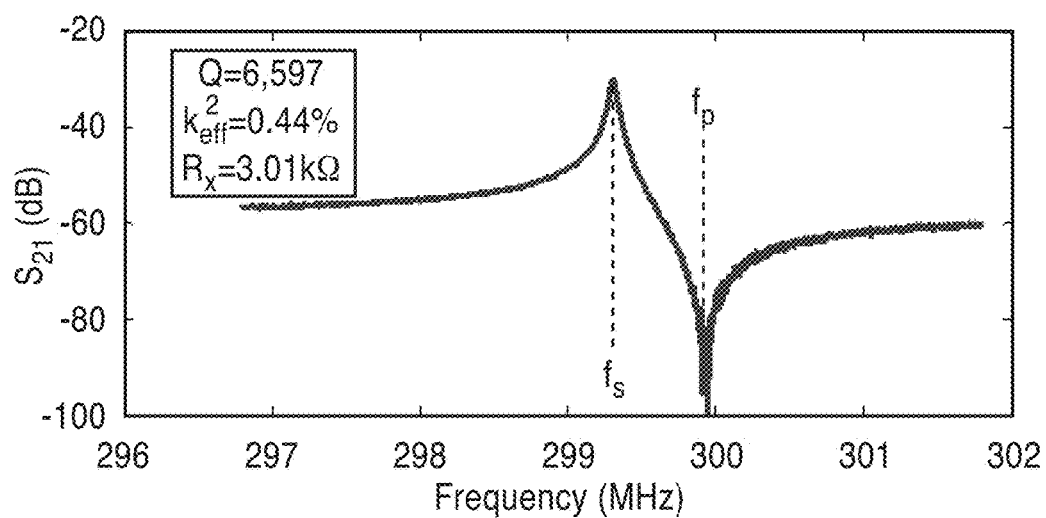
FIG. 5B is a graph of the frequency response for the oscillator with the highest $k_{eff}^2 \cdot Q$ product of 28.9.

Refer now to FIG. 5A and FIG. 5B. FIG. 5A is a graph of the frequency response for the resonator with the highest measured $$k_{eff}^2 = C_x/C_0$$

of 0.63%. FIG. 5B is a graph of the frequency response for the oscillator with the highest $k_{eff}^2 \cdot Q$ product of 29.0.

As expected, the $k_{eff}^2$ values on the order of the 0.63% measured in FIG. 5A for these capacitive-piezoelectric resonators are smaller than, or on par with, conventional contour-mode AlN resonator counterparts (with attached electrodes), but they are larger than achieved by capacitive-gap transduced devices at this frequency, and more importantly, are plenty large enough to satisfy the needs of channel-selecting RF front-ends.

To shut the device off, $V_b$ (302 in FIG. 3A) is raised until the electric fields between the top and bottom plates are large enough to pull the top plate down, taking with it the AlN resonator structure so that both end up collapsed to the substrate. With top and bottom electrodes abutted against, but not attached, to the AlN structure, frictional and structural losses become quite large. In addition, direct contact of the resonator between the AlN and the substrate, without the Bragg reflectors of solidly-mounted resonators (SMR's), also dissipates considerable energy.

It should be noted that in both FIG. 5A and FIG. 5B, the series resonant frequency $f_s$ is calculated by and the parallel $$f_s = 1/2\pi\sqrt{1/L_x C_x},$$

resonant frequency $f_p$ is calculated by $$f_p = f_s\sqrt{1 + C_x/C_0}.$$

These various circuit parameters are shown in the equivalent circuit of FIG. 3B.

Figure 6:
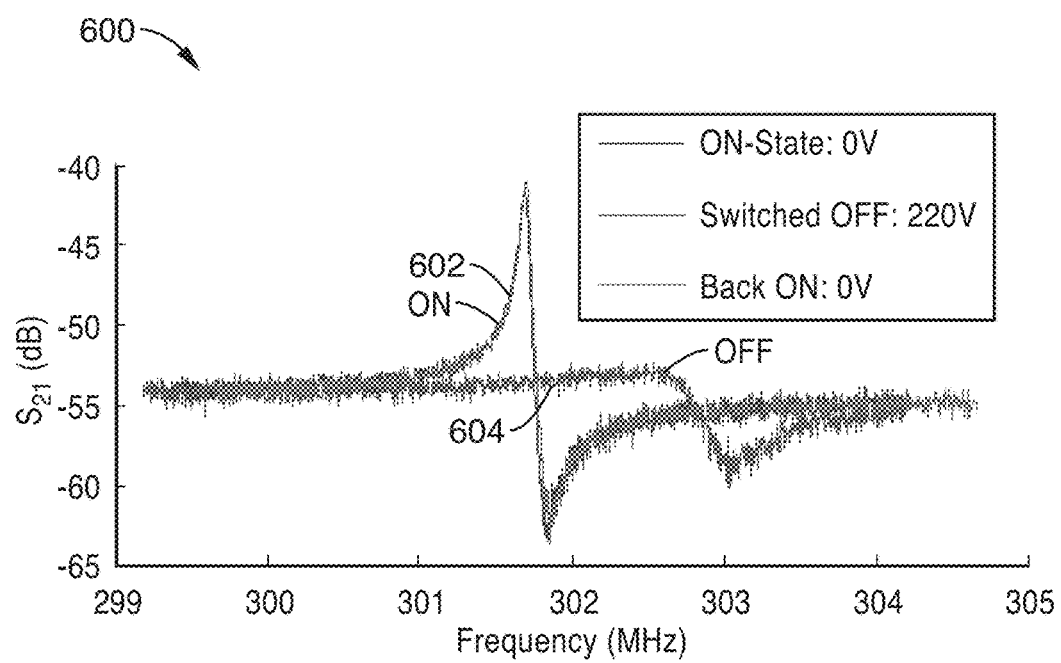
FIG. 6 is a graph demonstrating one embodiment of oscillator switching capability.

Refer now to FIG. 6, which shows a graph 600 demonstrating one embodiment of resonator switching capability. The ON curves 602 are essentially identical after turning the device OFF 604. The energy dissipated by voltage-induced collapse is large enough to completely remove the resonant peak of the ON curves 602, as shown in the measured $S_{21}$ curves before and after application of a suitable pull-in $V_b$ applied between the top electrode and the bottom electrode. Here, the pull-down voltage of 220V used for the bias voltage $V_b$ is somewhat high, but not greatly dissimilar from voltages normally needed to actuate RF MEMS switches. By redesigning the tunable disk resonator to incorporate smaller gaps and proper device suspension, the switching voltages can be made much smaller.

The resonator is in the ON-state when no switching voltage is applied. Next, a DC bias voltage $V_b$ of 220V is applied, causing the top electrode to collapse, effectively switching OFF the device. When the switching bias voltage $V_b$ is removed (set to 0 V), the resonator returns to the ON-state, with no degradation in performance. In one test, twenty ON OFF switching cycles were applied with no reduction in performance and no failure observed.

Figure 7A:
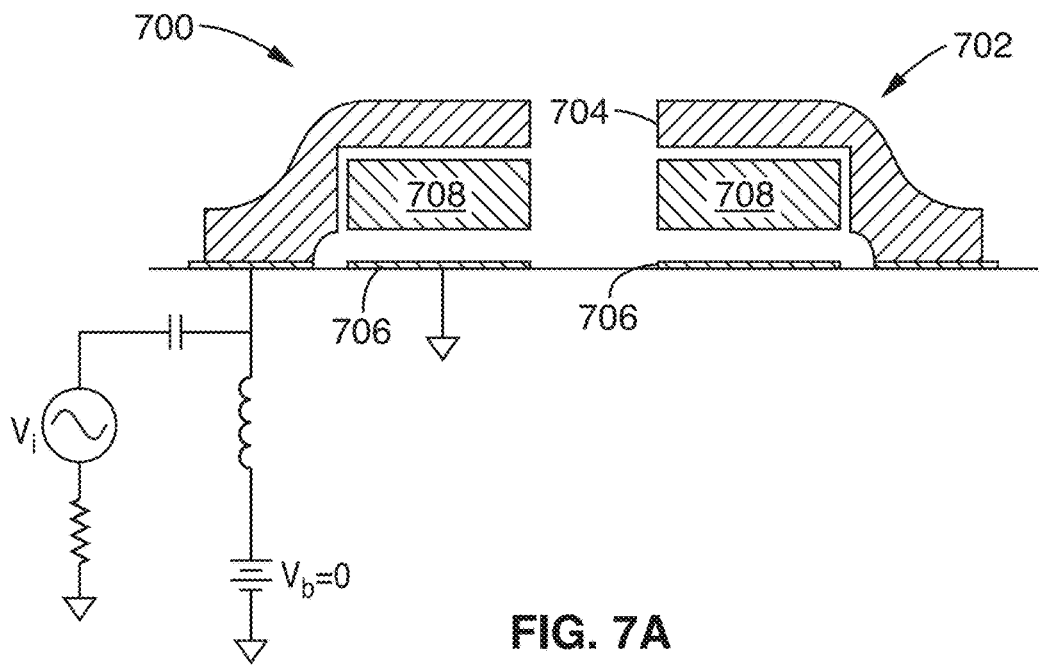
Figure 7B:
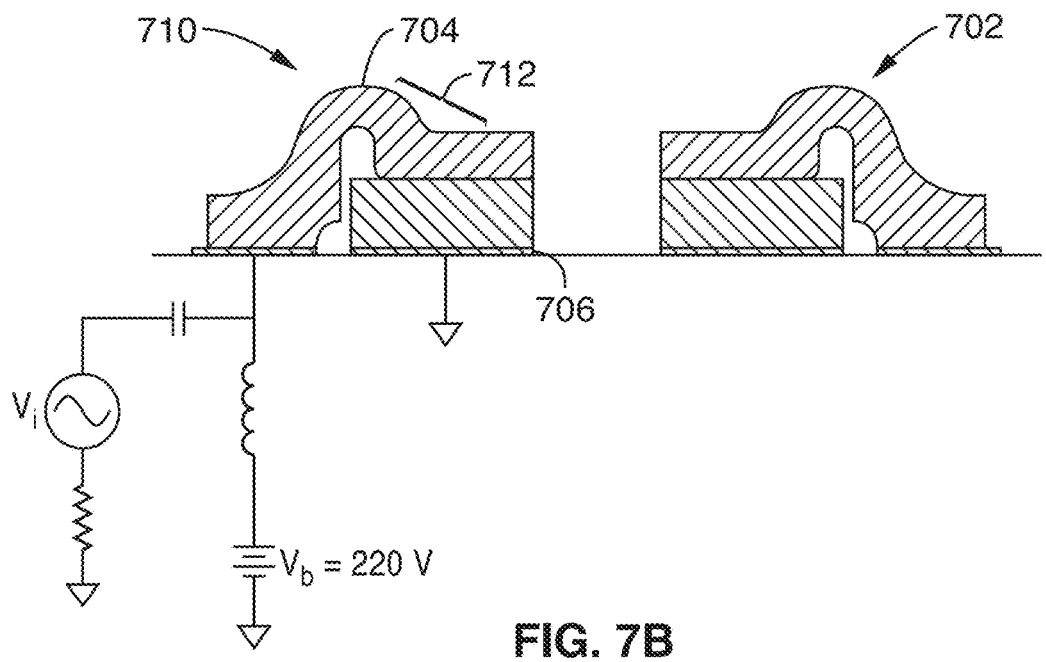
FIG. 7B is a cross sectional view of the switched oscillator of FIG. 7A, where a bias tee has applied a voltage sufficient to cause contact between the oscillator and the surrounding structure.

Refer now to FIGS. 7A and 7B, which diagram the operation of the switched oscillator. FIG. 7A is a cross sectional view 700 of a switched oscillator 702, where the oscillator is ON. Here, the top electrode 704 and bottom electrode 706 are not in any contact with the AlN resonator 708, allowing the resonator 708 to operate at its maximum Q mode. For this type of operation, $V_b$=0 V.

FIG. 7B is a cross sectional view 710 of the switched oscillator 702 of FIG. 7A, where a bias voltage $V_b$ has been applied between the top electrode 704 and the bottom electrode 706 sufficient to cause mechanical contact to occur between the resonator 708, the bottom electrode 706, and the top electrode 704. Here, it is observed that the top electrode 704 has flexed 712 due to the electrostatic forces generated by bias voltage $V_b$, thereby pinning the resonator 708 between the bottom electrode 706 and the top electrode 704. Here, the bias voltage $V_b$=220 V, following the example of FIG. 6.

Refer now to FIG. 8, which is a perspective view of a four terminal switched three-resonator piezoelectric filter 800.

A center resonator 802 is disposed between a bottom electrode 804 and a top electrode 806. The top electrode 806 is attached to a substrate (not shown here) through one or more compliant structures 808 to permit vertical translation 810 of the top electrode 806. The vertical translation 810 of the top electrode 806 affects the capacitive coupling of the top electrode 806 to the center resonator 802 through a change in a gap 812 between them. By modification of the bias voltage $V_b$ 814, the gap 812 is changed.

By changing the gap 812, the capacitive coupling between the top electrode 806 and the center resonator 802 may be changed. This affects the resonant frequency of the center resonator 802, which then also affects the resonant frequencies of the entire structure. Alternatively, the top electrode 806 can be pulled down so that the center resonator 802 contacts the bottom electrode 804. This turns OFF the center resonator 802, which turns OFF the whole filter 800 structure, effectively turning off the filter 800 without changing its input or output capacitance. An important design consideration is to maintain constant total input and output capacitances when many such filters are used in a parallel bank.

Furthermore, when bias voltage $V_b$ 814 exceeds a critical value necessary for switching, the gap 812 reduces to zero, and the Q of the center resonator is dramatically reduced via friction and other energy loss mechanisms so that the filter's pass band is largely eliminated, killing signal transmission and effectively turning the filter off.

A mechanical input 816 (typically quarter wavelength) couples an input resonator 818 disposed between a bottom electrode 820 and a fixed top electrode 822 to the center resonator 802. Unlike the movable top electrode 806 of the center resonator 802, the fixed top electrode 822 does not have compliant structures 808 to permit vertical translation 810, however, such structures could be added.

A voltage $V_{in}$ input source 824 with input reactance $Z_{0,in}$ 826 is applied to the top electrode 822. This input terminal 828 forms the input of the overall device.

Similar to the input resonator 818 structure, there is a mechanical output 830 that couples to an output resonator 832 disposed between an output bottom electrode 834 and an output fixed top electrode 836. Unlike the movable top electrode 806 of the center resonator 802, the fixed output top electrode 836 does not have compliant structures 808 to permit vertical translation 810, however, such structures could be added.

The output top electrode 836 provides an output terminal 838 that provides an output signal to load $Z_{0,out}$ 840.

In this particular filter embodiment, which exhibits a $3^{rd}$ order narrowband high-Q filter response, the electromechanical filter consists of a 3 degree-of-freedom (DOF)

mechanically resonant piezoelectric resonator assembly: an input resonator 818, a center resonator 802, and an output resonator 832.

The input electromechanical transducer top electrode 822 and bottom electrode 820 pair are not in direct contact with input resonator 818, allowing for high-Q operation. During ON state operation, switching center resonator 802 top electrode 806 and bottom electrode 804 pair do not contact center resonator 802. During the filter 800 ON state, the output transducer top electrode 836 and bottom electrode 834 pair also do not directly contact output resonator 832.

The independent resonators are the input resonator 818, the center resonator 802, and the output resonator 832, which are mechanically linked using quarter-wavelength extensional coupling beams to effect a mechanical energy transfer function. The resulting filter 800 has three distinct and closely spaced eigen frequencies that determine both the bandwidth and center frequency of the narrowband filter. The relative stiffnesses of mechanical input 816 and mechanical output 830 coupling beams, when compared to the individual stiffnesses of input resonator 818, center resonator 802, and output resonator 832 determine the spacing of these eigen frequencies, and ultimately the fractional bandwidth of the overall filter, e.g., 0.2%.

A voltage $V_{in}$ input source 824 having the proper impedance $Z_{0,in}$ 826 needed to properly terminate the filter is applied to the top electrode 822. This input terminal 828 forms the input of the overall device.

Refer now to both FIG. 8A and FIG. 8B. FIG. 8B is a circuit element describing the four terminal switched piezoelectric filter 800 of FIG. 8A. An $RF_{in}$ terminal 828, an $RF_{out}$ terminal 838, $V_b$ 814, and ground describe the operation of the four terminal switched piezoelectric filter.

Refer now to FIG. 9, which is a top view 900 of one example of the simplified four terminal switched piezoelectric filters of FIG. 8A using coupled array-composites for each of its three effective resonators. In this embodiment of a $3^{rd}$ order filter, three array-composite resonators, 902, 904, and 906, are coupled together using extensional coupling beams of acoustic length $3\lambda/4$ to create a 3 degree-of-freedom (DOF) mechanical structure. Array-composite resonators, within which individual coupled resonators retain their original mode shapes but vibrate in unison, in this embodiment consisting of nine disks each, are used to a) increase power handling and linearity in the device, b) reduce the required filter terminating impedances $Z_{0,in}$ and $Z_{0,out}$ to desired and more reasonable values ranging from 50-1000Ω, and c) reduce resonance frequency mismatches, which occur due to finite manufacturing tolerances, via averaging, so that the three coupled resonators are sufficiently frequency matched to effect a proper filter pass band response.

The switched electromechanical filter 900, which differs from the filter of FIG. 8B primarily in its use of composite disk array resonators, consists of nine $\lambda/2$-coupled input resonators 902 on the left, nine $\lambda/2$-coupled output resonators 904 on the right, and nine $\lambda/2$-coupled intermediate resonators 906 in the center. The center resonators 906 are Q controlled by the previously described bias voltage $V_b$ 908.

The four terminals of the filter would again be the input terminal 910, the output terminal 912, bias voltage $V_b$ 908, and electrical ground that surrounds the device 914 while also being electrically connected to one electrode of each resonator.

Such a switched filter 900 may be placed in parallel with many other such filters, having various resonance frequencies, to allow for arbitrarily large numbers of frequency selections, as would be needed for an RF channel selecting radio front end filter bank. To compensate for large input and output capacitances present at the input and output ports resulting from the use of many filters in parallel, an inductor at each port could be used to counteract undesired capacitance, or even effect an impedance transformation to more easily interface high impedance filters with a 50Ω RF system over a broad frequency range.

Figure 10A:
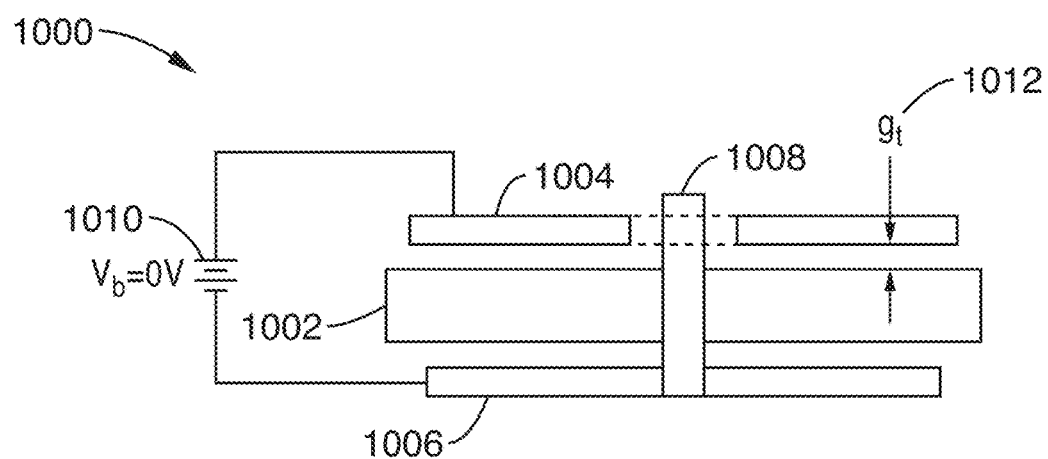
FIG. 10A is a partial cross sectional view of a resonator disposed between two electrodes with 0 V applied between the electrodes.
Figure 10B:
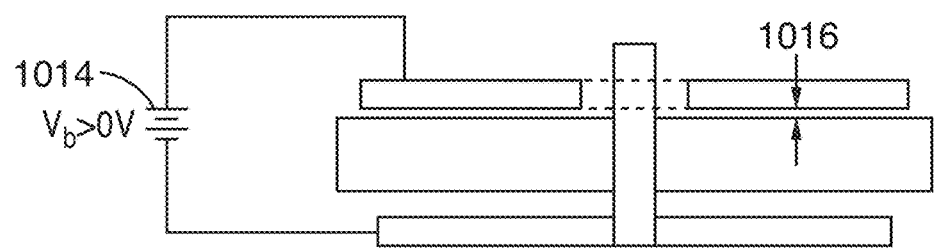
FIG. 10B is a partial cross sectional view of the resonator of FIG. 10A with a bias voltage greater than 0 V applied between the electrodes, effecting a change in gap between the top electrode and the resonator, with a consequent change in resonator resonant frequency.

Refer now to FIG. 10A and FIG. 10B, which are simplified partial cross sectional views 1000 of a resonator disposed between two electrodes. In FIG. 10A, the resonator 1002 is shown with 0 V applied between the top electrode 1004 and bottom electrode 1006. The central stem 1008 supports the resonator 1002 where there is nominally no contact between the top electrode 1004, bottom electrode 1006, and the resonator 1002. This 0V electrode bias voltage $V_b$ 1010 describes the basic design state of the resonator 1002, with the nominal design top gap $g_t$ 1012. Here the capacitance between the resonator 1002 and the top electrode 1004 may be expressed as $$c_{gt} = \frac{\varepsilon_0 A_{electrode}}{g_t},$$

where $g_t$ is the nominally design tuned gap $g_t$ 1012, $\varepsilon_0$ is the free space permittivity, and $A_{electrode}$ is the area of capacitive coupling between the top electrode 1004 and the resonator 1002.

FIG. 10B is a partial cross sectional view of the resonator of FIG. 10A with a bias voltage $V_b$ 1014 greater than 0 V applied between the electrodes, effecting a decrease in gap $g_t$ 1016 between the top electrode 1004 and the resonator 1002. With a decrease in gap $g_t$ 1016 the $c_{gt}$ increases (due to smaller $g_t$ 1016), which consequently decreases the resonator series resonant frequency.

Figure 10C:
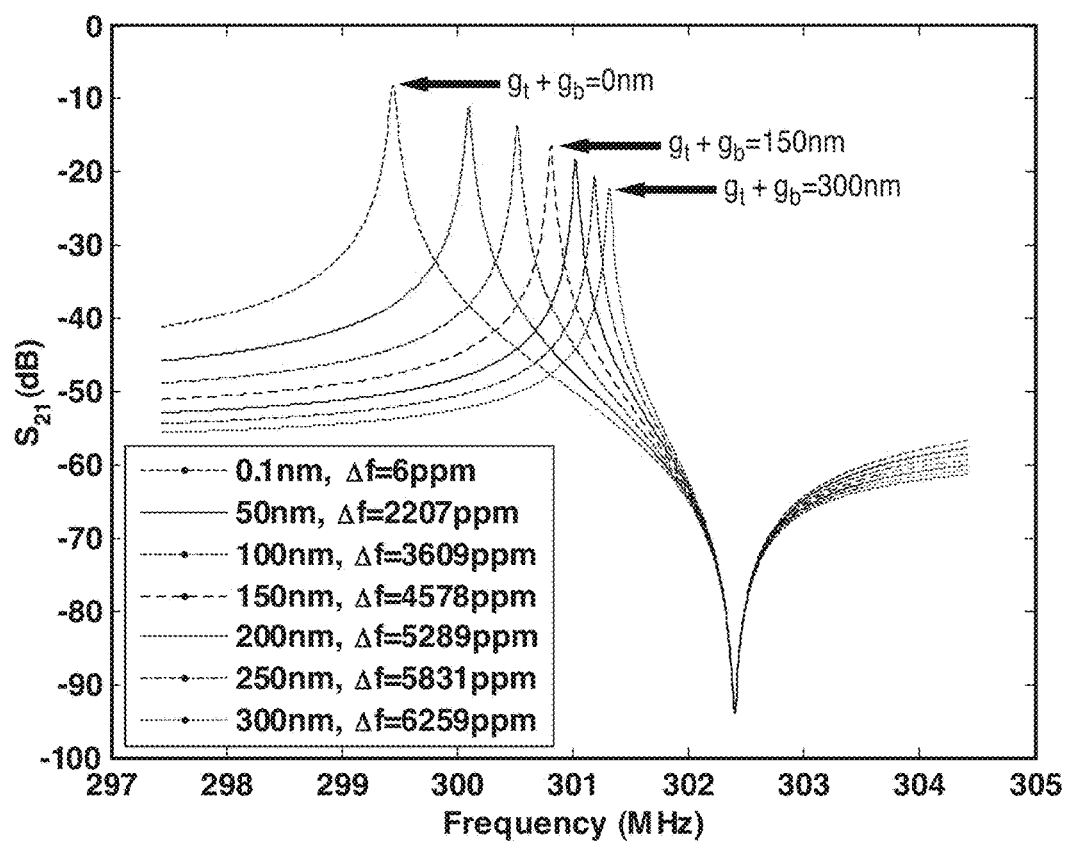
FIG. 10C is a simulated graph of the frequency response of the resonator of FIG. 10A with different changes in gap spacing between the top electrode and the resonator, with consequent changes in the resonator's series resonant frequency.

Refer now to FIG. 10C, which is a simulated graph of the frequency response of the resonator of FIG. 10A with different changes in gap spacing between the top electrode and the resonator, with consequent changes in series resonator resonant frequency. In this set of curves, the annotation "$g_t+g_b$" refers to the sum of the gaps from resonator 1002 to the top electrode $g_t$1004, and the gap from the bottom electrode $g_b$ to the resonator 1002.

One can clearly see from the graph that as the sum of "$g_t+g_b$" increases from 0 to 300 nm, the resonator 1002 series resonant frequency increases. Such control over the series resonant frequency in piezoelectric resonators, without the need for external variable capacitors, is a desirable feature.

The bias-voltage-actuated top electrode pull down mechanism additionally provides an added capability to continuously tune the series resonance frequency $f_s$ of a resonator to compensate for unwanted frequency variations due to environmental changes (e.g., temperature) and fabrication variability. Clearly, modulating the size of the top and bottom spacer gaps ($g_t$ and $g_b$) alters the series capacitance placed around the core resonator; as this capacitance is altered, the series resonance frequency shifts, as simulated in FIG. 10C. In principle, frequency shifts of ~6000 ppm are possible via reducing the gaps from 300 nm to 0 nm. Since temperature coefficients of frequency (TCF's) for AlN resonators are measured to be as large as 25 parts per million (ppm)/° C., the temperature dependence of resonance frequency could be compensated via a bias voltage $V_b$ over the military temperature range extending from ~40 to +125° C. Additionally, frequency mismatches due to nonzero manufacturing tolerances, measured with standard deviations of 700 ppm or less at 300 MHz, could be compensated using this method.

From the description herein, it will be appreciated that that the present disclosure encompasses multiple embodiments which include, but are not limited to, the following:

1. A resonator, comprising: a substrate comprising a bottom electrode; a resonator disposed above the substrate; and a top electrode disposed above the resonator; wherein the top electrode is attached in part to the substrate.

2. The resonator of any preceding embodiment, further comprising a bias voltage Vb source electrically connected between the top electrode and the bottom electrode.

3. The resonator of any preceding embodiment, wherein the resonator is an aluminum nitride (AlN) resonator.

4. The resonator of any preceding embodiment, wherein the resonator is a disk.

5. The resonator of any preceding embodiment, wherein a Q of the resonator is selected from a group of Q's consisting of: Q≥1000, Q≥2000, Q≥6000, Q≥8000, and Q≥8800.

6. The resonator of any preceding embodiment, wherein the top electrode is flexed into at least partial mechanical contact with the resonator upon application of a sufficient bias voltage Vb between the top electrode and the bottom electrode.

7. The resonator of any preceding embodiment, wherein the resonator is flexed into at least partial mechanical contact with the substrate upon application of a sufficient bias voltage Vb from the bias voltage source.

8. The resonator of any preceding embodiment, wherein the resonator is flexed into at least partial mechanical contact with the substrate and the top electrode upon application of a sufficient bias voltage Vb from the bias voltage source between the top electrode and the bottom electrode.

9. The resonator of any preceding embodiment, wherein the flexure of the resonator into mechanical contact with the substrate is due to flexure of the top electrode due to electrostatic forces generated through the application of the bias voltage Vb between the top electrode and the bottom electrode.

10. The resonator of any preceding embodiment, wherein the flexure of the top electrode is due to electrostatic forces generated through the application of the bias voltage Vb from the bias voltage source between the top electrode and the bottom electrode.

11. The resonator of any preceding embodiment, wherein the oscillator is suspended over the substrate by a central stem.

12. The resonator of any preceding embodiment, wherein the flexure of the top electrode reduces the Q of the resonator through frictional losses.

13. The resonator of any preceding embodiment, wherein the resonator is a variable Q resonator.

14. The resonator of any preceding embodiment, wherein the resonator is a switched resonator.

15. The resonator of any preceding embodiment, wherein one or more switched resonators are present within a radio frequency (RF) front end.

16. A method of signal switching, comprising: (a) providing a switching resonator, comprising: (a) a substrate comprising a bottom electrode; a resonator disposed above the substrate; and a top electrode disposed above the resonator; wherein the top electrode is attached in part to the substrate; and (b) applying a bias voltage Vb between the bottom electrode and the top electrode.

17. The method of signal switching of any preceding embodiment, further comprising: applying the bias voltage Vb sufficient to dampen resonator oscillation through energy loss mechanisms of the resonator with other components of the switching resonator; wherein an input signal applied to the resonator is not output, resulting in an OFF state for the switching resonator.

18. The method of signal switching of any preceding embodiment, further comprising: applying the bias voltage Vb where the resonator oscillation experiences no frictional contact with other components of the switching resonator; wherein an input signal applied to the resonator is output, resulting in an ON state for the switching resonator.

19. The method of signal switching of any preceding embodiment, further comprising: applying the bias voltage Vb where the resonator oscillation experiences no frictional contact with other components of the switching resonator; wherein a series resonant frequency of the resonator is changed.

20. A capacitive-piezoelectric disk resonator having a construct comprising: a silicon substrate; an $SiO_2$ layer disposed on the silicon substrate; a silicon nitride layer disposed on the $SiO_2$ layer; an AlN layer disposed on the silicon nitride layer; a polysilicon central stem disposed on the AlN layer; an AlN disk resonator supported by the central stem; a molybdenum bottom electrode disposed on the AlN layer; and a polysilicon deformable top electrode attached in part to the AlN layer; wherein the top electrode is disposed in part above the AlN disk resonator; wherein the bottom electrode is disposed in part below the AlN disk resonator; and wherein absent an electrical potential between the top and bottom electrodes, the AlN disk resonator does not contact either electrode.

21. A tunable resonator, comprising: a substrate comprising a bottom electrode; a resonator disposed above the substrate; and a top electrode disposed above the resonator; wherein the top electrode is attached in part to the substrate through a compliant structure.

22. The tunable resonator of any preceding embodiment, wherein when a bias voltage, Vb, is applied between the bottom electrode and the top electrode, the top electrode is displaced by the bias voltage, Vb, through movement of the top electrode through movement of the compliant structure.

23. The tunable resonator of any preceding embodiment, further comprising: a top gap, gt, disposed between the resonator and one of the electrodes; wherein a series resonant frequency $f_s$ of the resonator is changed through alteration of the top gap, gt.

24. The tunable resonator of any preceding embodiment, further comprising: a feedback control system that controls the bias voltage, Vb; wherein the series resonant frequency $f_s$ of the resonator is controlled within a design range.

25. A filter, comprising: (a) a tunable oscillator, comprising: a substrate comprising a bottom electrode; a tunable resonator disposed above the bottom electrode; a top electrode disposed above the tunable resonator; wherein the top electrode is attached in part to the substrate; and a bias voltage Vb source electrically connected between the top electrode and the bottom electrode; (b) an input resonator, comprising: an input substrate, comprising an input bottom electrode; an input resonator disposed above the input substrate; and an input top electrode disposed above the input substrate; wherein an input capacitance to the input resonator has a value of Ci; (c) an output resonator, comprising: an output substrate, comprising an output bottom electrode; an output resonator disposed above the output substrate; and an output top electrode disposed above the output substrate; wherein an output capacitance to the output resonator has a value of Co; (d) an input coupler, wherein vibration from the input resonator is mechanically coupled to the tunable resonator; and (e) an output coupler, wherein vibration from the tunable resonator is mechanically coupled to the output resonator.

26. The filter of any preceding embodiment, wherein the input capacitance Ci and the output capacitance Co remain unchanged regardless of the applied bias voltage Vb.

27. The filter of any preceding embodiment, wherein the application of bias voltage Vb. effects a change in a resonant frequency of the tunable resonator.

28. The filter of any preceding embodiment, wherein the application of a sufficient bias voltage Vb. effects switches the filter ON or OFF.

29. The filter of any preceding embodiment, wherein the tunable oscillator substrate, the input substrate, and the output substrate are disposed on a wafer.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A resonator, comprising:
   a substrate comprising a bottom electrode;
   a radial contour mode resonator disposed above the substrate; and
   a top electrode disposed above the resonator;
   a bias voltage $V_b$ source electrically connected between the top electrode and the bottom electrode;
   wherein the top electrode is attached in part to the substrate.

2. The resonator of claim 1, wherein the resonator is suspended over the substrate by a central stem.

3. The resonator of claim 1, wherein the resonator is an aluminum nitride (AlN) resonator.

4. The resonator of claim 3, wherein the resonator is a disk.

5. The resonator of claim 1, wherein a Q of the resonator is selected from a group of Q's consisting of: Q≥1000, Q≥2000, Q≥6000, Q≥8000, and Q≥8800.

6. The resonator of claim 1, wherein the top electrode is flexed into at least partial mechanical contact with the resonator upon application of a sufficient bias voltage $V_b$ between the top electrode and the bottom electrode.

7. The resonator of claim 6, wherein the flexure of the top electrode is due to electrostatic forces generated through the application of the sufficient bias voltage $V_b$ from the bias voltage source between the top electrode and the bottom electrode.

8. The resonator of claim 7, wherein the flexure of the top electrode reduces the Q of the resonator through frictional losses.

9. The resonator of claim 8, wherein the resonator is a variable Q resonator.

10. The resonator of claim 8, wherein the resonator is a switched resonator.

11. The resonator of claim 10, wherein one or more of the switched resonators are present within a radio frequency (RF) front end.

12. The resonator of claim 1, wherein the resonator is flexed into at least partial mechanical contact with the substrate upon application of a sufficient bias voltage $V_b$ from the bias voltage source.

13. The resonator of claim 1, wherein the resonator is flexed into at least partial mechanical contact with the substrate and the top electrode upon application of a sufficient bias voltage $V_b$ from the bias voltage source between the top electrode and the bottom electrode.

14. The resonator of claim 1, wherein a sufficient bias voltage $V_b$ between the top electrode and the bottom electrode causes a mechanical contact between the resonator and the top and bottom electrodes.

15. A method of signal switching, comprising:
   (a) providing a switching resonator, comprising:
      a substrate comprising a bottom electrode;
      a radial contour mode resonator disposed above the substrate; and
      a top electrode disposed above the resonator;
      wherein the top electrode is attached in part to the substrate; and
   (b) applying a bias voltage $V_b$ between the bottom electrode and the top electrode.

16. The method of signal switching of claim 15, further comprising:
   applying the bias voltage $V_b$ sufficient to dampen resonator oscillation through energy loss mechanisms of the resonator with other components of the switching resonator;
   wherein an input signal applied to the resonator is not output, resulting in an OFF state for the switching resonator.

17. The method of signal switching of claim 15, further comprising:
   applying the bias voltage $V_b$ where the resonator oscillation experiences no frictional contact with other components of the switching resonator;
   wherein an input signal applied to the resonator is output, resulting in an ON state for the switching resonator.

18. The method of signal switching of claim 15, further comprising:
   applying the bias voltage $V_b$ where the resonator oscillation experiences no frictional contact with other components of the switching resonator;
   wherein a series resonant frequency of the resonator is changed.

19. A capacitive-piezoelectric disk resonator having a construct comprising:
   a silicon substrate;
   an $SiO_2$ layer disposed on the silicon substrate;
   a silicon nitride layer disposed on the $SiO_2$ layer;
   an AlN layer disposed on the silicon nitride layer;
   a polysilicon central stem disposed on the AlN layer;
   an AlN disk resonator supported by the central stem;

a molybdenum bottom electrode disposed on the AlN layer; and a polysilicon deformable top electrode attached in part to the AlN layer;

wherein the top electrode is disposed in part above the AlN disk resonator;

wherein the bottom electrode is disposed in part below the AlN disk resonator; and wherein absent an electrical potential between the top and bottom electrodes, the AlN disk resonator does not contact either electrode.

20. A tunable resonator, comprising:

a substrate comprising a bottom electrode;

a resonator disposed above the substrate; and a top electrode disposed above the resonator;

wherein the top electrode is attached in part to the substrate through a compliant structure;

wherein when a bias voltage, $V_b$, is applied between the bottom electrode and the top electrode, the top electrode is displaced by the bias voltage, $V_b$, through movement of the top electrode through movement of the compliant structure;

a top gap, $g_t$, disposed between the resonator and one of the electrodes;

wherein a series resonant frequency $f_s$ of the resonator is changed through alteration of the top gap, $g_t$;

a feedback control system that controls the bias voltage, $V_b$;

wherein the series resonant frequency fs of the resonator is controlled within a design range.

21. A filter, comprising:

(a) a tunable resonator, comprising:

a substrate comprising a bottom electrode;

a tunable resonator disposed above the bottom electrode;

a top electrode disposed above the tunable resonator;

wherein the top electrode is attached in part to the substrate; and a bias voltage $V_b$ source electrically connected between the top electrode and the bottom electrode;

(b) an input resonator, comprising:

an input substrate, comprising an input bottom electrode;

an input resonator disposed above the input substrate; and an input top electrode disposed above the input substrate;

wherein an input capacitance at the input resonator has a value of $C_i$;

(c) an output resonator, comprising:

an output substrate, comprising an output bottom electrode;

an output resonator disposed above the output substrate; and an output top electrode disposed above the output substrate;

wherein an output capacitance at the output resonator has a value of $C_o$;

(d) an input coupler, wherein vibration from the input resonator is mechanically coupled to the tunable resonator; and (e) an output coupler, wherein vibration from the tunable resonator is mechanically coupled to the output resonator.

22. The filter of claim 21, wherein the input capacitance $C_i$ and the output capacitance $C_o$ remain unchanged regardless of the applied bias voltage $V_b$.

23. The filter of claim 21, wherein the application of the bias voltage $V_b$ effects a change in a resonant frequency of the tunable resonator.

24. The filter of claim 21, wherein the application of a sufficient bias voltage $V_b$ effectively switches the filter ON or OFF.

25. The filter of claim 21, wherein the tunable oscillator substrate, the input substrate, and the output substrate are disposed on a wafer.

* * * * *